(12) United States Patent
Ruething et al.

(10) Patent No.: US 7,470,952 B2
(45) Date of Patent: Dec. 30, 2008

(54) POWER IGBT WITH INCREASED ROBUSTNESS

(75) Inventors: Holger Ruething, Munich (DE); Hans-Joachim Schulze, Ottobrunn (DE); Manfred Pfaffenlehner, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/598,243

(22) Filed: Nov. 9, 2006

(65) Prior Publication Data

US 2007/0120181 A1 May 31, 2007

(30) Foreign Application Priority Data

Nov. 9, 2005 (DE) .................. 10 2005 053 487

(51) Int. Cl.
*H01L 29/76* (2006.01)
(52) U.S. Cl. .................. 257/327; 257/328; 257/329; 257/335; 257/341; 257/E29.027
(58) Field of Classification Search .......... 257/327, 257/328, 335, 341, 342, 492, 493, E29.027, 257/E29.028, E29.066, E29.067, E29.198, 257/E29.201, E29.256, E29.257, 329
See application file for complete search history.

(56) References Cited

U.S. PATENT DOCUMENTS 6,710,405 B2 * 3/2004 Zommer et al. ............. 257/341

| | | | |
|---|---|---|---|
| 2002/0179950 A1 | 12/2002 | Hijzen et al. | |
| 2003/0107102 A1 | 6/2003 | Ozeki et al. | |
| 2004/0144992 A1 * | 7/2004 | Willmeroth et al. | 257/107 |
| 2005/0035405 A1 * | 2/2005 | Mauder et al. | 257/341 |
| 2005/0133857 A1 * | 6/2005 | Mauder et al. | 257/327 |

FOREIGN PATENT DOCUMENTS

| DE | 102 50 575 A1 | 5/2004 |
|---|---|---|
| DE | 103 24 100 A1 | 12/2004 |
| DE | 103 30 571 A1 | 2/2005 |

OTHER PUBLICATIONS

Baliga, B. Jayant. *Power Semiconductor Devices*. Boston: PWS Publishing Company, 1996. 428-431. (4 Pages).
Stengl, Jens Peer and Jenö Tihanyi. *Leistungs-MOS-FET-Praxis*. Munich: Pflaum, 1992. 33, 101-104. (5 Pages).

* cited by examiner

*Primary Examiner*—Minh-Loan Tran
*Assistant Examiner*—Selim Ahmed
(74) *Attorney, Agent, or Firm*—Maginot, Moore & Beck (57) ABSTRACT

A power IGBT includes a semiconductor body having an emitter zone of a first conduction type and a drift zone of a second conduction type proximate to the emitter zone. The IGBT further includes a cell array, each transistor cell of the array having a source zone, a body zone disposed between the source zone and the drift zone, the body zone and source zone short-circuited, and a gate electrode configured to be insulated with respect to the source zone and the body zone. The cell array has a first cell array section with a first cell density and a second cell array section with a second cell density that is lower than the first cell density. The emitter zone has a lower emitter efficiency in a region corresponding to the second cell array section than in a region corresponding to the first cell array section.

10 Claims, 10 Drawing Sheets

POWER IGBT WITH INCREASED ROBUSTNESS

TECHNICAL FIELD

The present invention relates to a power IGBT.

BACKGROUND

Power IGBTs are described, for example, in Stengl, Tihanyi: "Leistungs-MOS-FET-Praxis" [Power MOS-FET practice], Pflaum Verlag, Munich, 1992, pages 101-104 or in Baliga: "Power Semiconductor Devices", PWS Publishing, 1995, pages 428-431.

Figure 1:
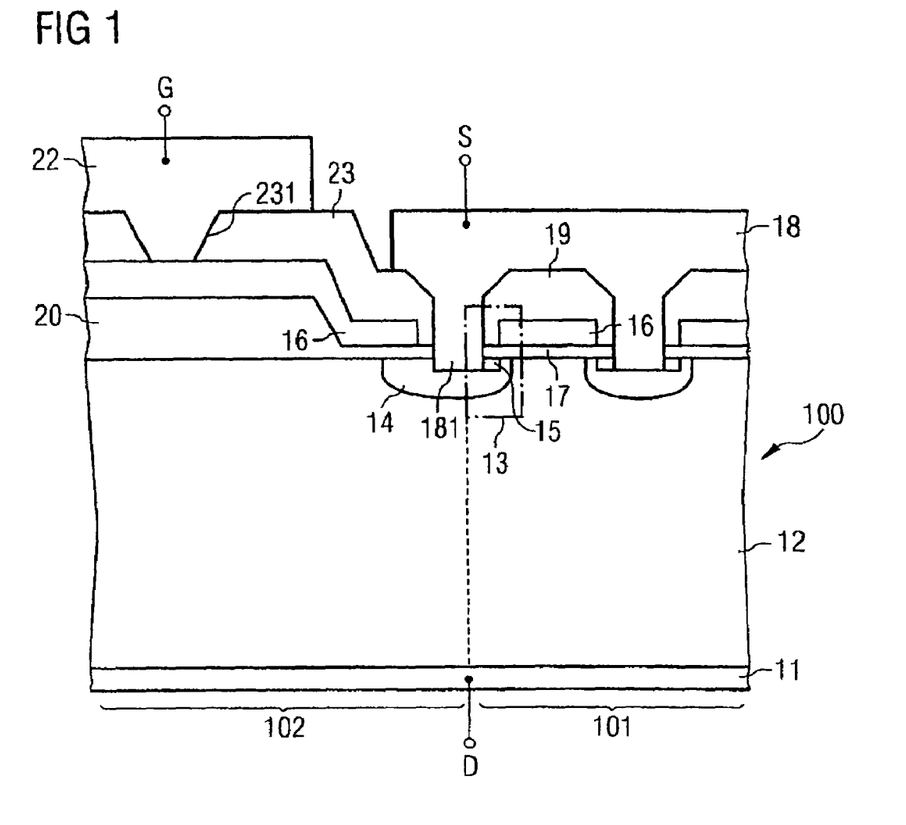
FIG. 1 shows part of a cross section through a vertical power IGBT.

FIG. 1 shows part of a cross section through a vertical power IGBT. This IGBT comprises a semiconductor body 100 having an emitter zone 11 which, in the component according to FIG. 1, is arranged in the region of a rear side of the semiconductor body 100. This emitter zone 11 is also referred to as a collector in the case of an IGBT. The emitter zone 11 is adjoined by a drift zone 12 which is complementarily doped with respect to the emitter zone 11. A cell array having a number of identically constructed transistor cells is present in the region of a front side of the semiconductor body 100 that is opposite the rear side. Each of these transistor cells comprises a source zone 15 and a body zone 14 which is arranged between the source zone 15 and the drift zone 12, the body zone 14 being complementarily doped with respect to the source zone 15 and the drift zone 12.

In order to control a conductive channel or an inversion channel in the body zone 14 between the drift zone 12 and the source zone 15, there is a gate electrode 16 which is arranged adjacent to the source zone 15 and the body zone 14 and is insulated with respect to the semiconductor body by means of a gate insulation layer 17. The body zones 14 are arranged at a distance from one another in the drift zone 12. The body zones 14, for example, have a rectangular or hexagonal cross section in a plane that runs perpendicular to the plane of the drawing illustrated in FIG. 1. The gate electrode 16 is in the form of a grid in this plane, as described, for example, in Stengl, Tihanyi, loc cit., page 33, and has recesses which are used by a terminal electrode 18 to contact-connect the source zones 15 and body zones 14 of the individual transistor cells and to thereby short-circuit these zones 14, 15. In this case, the gate electrode 16 is insulated with respect to this terminal electrode 18 by means of a further insulation layer 19.

The vertical power IGBT turns on when a positive voltage is applied between the emitter zone 11 and the terminal electrode 18, which is also referred to as a source electrode, and when a suitable drive potential for forming an inversion channel in the body zone 14 is applied to the gate electrode 16. When the IGBT is on, the drift zone 12 is flooded with p-type charge carriers or holes which, when the power IGBT is being switched off, must flow away, via the body zones 14, to the terminal electrode 18 which is at the lower potential. When switching off the component, it is necessary to ensure that a change in the gate potential for turning off the component takes place so slowly that a temporal change in the voltage, which is applied across the component, or a temporal change in the current, which flows through the component, does not exceed prescribed limiting values during the switching-off operation. These limiting values are specifically prescribed by the manufacturer and are used to ensure operation of the component in the so-called SOA range (SOA=Safe Operating Area).

If the component is switched off too rapidly, a so-called "latch-up" of the component may result. Latch-up is an operation in which a parasitic npn bipolar transistor which is formed from the n-doped source zone 15, the p-doped body zone 14 and the n-doped drift zone 12 switches on. As a result of this parasitic npn bipolar transistor switching on, a parasitic thyristor which is formed from the source zone 15, the body zone 14, the drift zone 12 and the emitter zone 11 fires, thus resulting in it no longer being possible to control the component and in possible destruction. The parasitic npn bipolar transistor switches on when the hole current flowing away from the drift zone 12 when the component is being switched off is so high that the voltage drop caused by this hole current under the source zones 15 in the body zone 14 is greater than the threshold voltage of the parasitic bipolar transistor.

Regions of the cell array in which the cell density is reduced in comparison with other regions of the cell array and in which there are thus fewer terminal contacts to the source electrode 18 for the purpose of removing the holes from the drift zone 12 are particularly critical as regards the "latch-up" behavior. In the component according to FIG. 1, the reference symbol 102 is used to represent a region having such a reduced cell density. In the example, it is a region in which, in addition to the cell array, there is a gate lead 22 which is used to connect the gate electrode 16 to a gate potential in a low-impedance manner. There are no transistor cells and, in particular, no terminals to the source electrode 18 under this gate lead 22 in the drift zone 12. When the component is being switched off, holes must flow away, under these gate leads 22, from the region of the drift zone 12 via the body zones 14 of transistor cells which are arranged adjacent to this region 102 with a reduced cell density. When the component is being switched off, the hole current density is thus increased in these adjacent transistor cells in comparison with other transistor cells in the cell array which are arranged at a greater distance from the region 102, with the result that the risk of a "latch-up" is particularly high as regards these transistor cells. In this case, these transistor cells limit the maximum permissible current or voltage changes for the entire component when switching off the component.

In this case, the current or voltage changes which occur in the component when it is being switched off are smaller the slower the switching-off operation. However, the switching losses increase as the duration of the switching-off operation increases.

SUMMARY

Embodiments of the present invention provide increased robustness in power IGBTs.

A first embodiment of the invention is a power IGBT that includes a semiconductor body having an emitter zone of a first conduction type and a drift zone of a second conduction type proximate to the emitter zone. The IGBT further includes a cell array, each transistor cell of the array having a source zone, a body zone disposed between the source zone and the drift zone, the body zone and source zone short-circuited, and a gate electrode configured to be insulated with respect to the source zone and the body zone. The cell array has a first cell array section with a first cell density and a second cell array section with a second cell density that is lower than the first cell density. The emitter zone has a lower emitter efficiency in a region corresponding to the second cell array section than in a region corresponding to the first cell array section.

Embodiments of the invention will be explained in more detail below with reference to figures.

DETAILED DESCRIPTION

In the figures, unless specified otherwise, the same reference symbols denote the same component regions with the same meaning.

The power IGBT according to an embodiment of the invention has a semiconductor body having an emitter zone of a first conduction type and a drift zone of a second conduction type which adjoins the emitter zone. The power IGBT also comprises a cell array having a number of transistor cells which each have a source zone, a body zone which is arranged between the source zone and the drift zone, and a gate electrode which is arranged in such a manner that it is insulated with respect to the source zone and the body zone, and in which the source zone and the body zone are short-circuited. The cell array has a first cell array section with a first cell density and a second cell array section with a second cell density that is lower than the first cell density. The second cell density may also be zero, in particular, which is synonymous with the fact that there are no transistor cells in the second cell array section.

For improving the "latch-up" behavior, the emitter zone has a lower emitter efficiency in the region of the second cell array section than in the region of the first cell array section. On account of this lower emitter efficiency of the emitter zone in the region of the second cell array section, there are fewer p-type charge carriers or holes in the drift zone in the region of this second cell array section, when the IGBT is turned on, than in a conventional component without such a reduction in the emitter efficiency. On account of this lower hole concentration in the region of the second cell array section, transistor cells which are arranged in a transition region between the first and second cell array sections are loaded with a smaller hole current than in a conventional component when the IGBT is being switched off, thus resulting in a diminished "latch-up" tendency of these transistor cells.

One embodiment of the invention provides for the emitter zone to have a first emitter section in the region of the first cell array section and a second emitter section in the region of the second cell array section. In order to reduce the emitter efficiency in the region of the second emitter section, provision is made in this case for an effective doping concentration of dopant atoms of the first conduction type of the second emitter section to be lower than an effective doping concentration of the first emitter section. This lower effective doping concentration of the second emitter section can be achieved by introducing fewer dopant atoms into the second emitter section than into the first emitter section when producing the emitter zone, for example by means of ion implantation and a subsequent annealing step.

The effective doping concentration of the second emitter section may also be reduced in comparison with the effective doping concentration of the first emitter section by first of all doping the two emitter sections in the same manner so that they have the same doping concentrations but then generating crystal defects in the region of the second emitter section. These defects reduce the effective doping concentration and can be produced, for example, by means of so-called "damage implantation" in which non-doping atoms are implanted into the second emitter zone where they result in crystal defects.

It is also possible to completely dispense with an emitter zone in the region of the second cell array section. However, the ability of the IGBT to block voltages in the reverse direction, that is to say negative drain-source voltages, is lost as a result of this.

In the case of a power IGBT which has a field stop zone of the same conduction type as the drift zone arranged in its drift zone, on the emitter side, that is to say closer to the emitter zone than to the body zone, between the body zones of the cell array and the emitter zone, it is possible, as an alternative or in addition to reducing the emitter efficiency by means of a reduced emitter doping, to dope this field stop zone more highly in the region of the second cell array section than in the region of the first cell array section in order to thus improve the "latch-up" behavior of the component. The increased doping of the field stop zone in the region of the second cell array section results—like a reduced doping of the emitter zone—in a reduction in the emitter efficiency and thus, when the power IGBT is turned on, in a reduced hole current density in the drift zone in the region of the second cell array section. In order to reduce the hole current density in the region of the second cell array section as effectively as possible, this zone having a reduced emitter efficiency preferably reaches, in the lateral direction, into the first cell array section. The extent of this zone having a reduced emitter efficiency into the first cell array section is preferably 0.1 to 2 diffusion lengths of free charge carriers.

As an alternative or in addition to reducing the emitter efficiency by locally reducing the emitter doping or by means of a locally increased doping concentration of the field stop zone, provision is made for the charge carrier lifetime for holes in the drift zone to be reduced, in comparison with other sections of the drift zone, in the region of the second cell array section. This results in fewer holes having to be removed from this region of the drift zone section via transistor cells in the transition region between the first and second cell array sections when the component is being switched off, thus likewise improving the "latch-up" behavior of the component. The charge carrier life-time of the drift zone in the region of the second cell array section can be achieved, in particular, by means of an increased concentration of crystal lattice defects in this section of the drift zone. However, it is also possible to locally diffuse in heavy metals, for example platinum.

As an alternative or in addition to the measures explained above, it is also possible, in order to improve the "latch-up" behavior, to configure one or more transistor cells in the transition region between the first and second cell array sections, in a direction from the second to the first cell array section, in such a manner that their source zone has smaller dimensions in the direction of the flow of holes than the source zones of transistor cells in other regions of the first cell array section. In comparison with a transistor cell having a source zone whose dimensions have not been reduced, this measure results in a higher hole current being able to flow without the parasitic bipolar transistor formed from the source zone, the body zone and the drift zone switching on. In particular, there may be one or more "modified transistor cells" in the transition region between the first and second cell array sections in a direction from the second to the first cell array section, said transistor cells having been modified in such a manner that they do not have a source zone.

In addition, it is possible to provide at least one transistor cell in the transition region between the first and second cell array sections in a direction from the second to the first cell array section, in which transistor cell the body zone under the source zone has at least one section having a doping concentration which is increased in comparison with other sections of the body zone. For a given hole current, this locally increased doping concentration results in a reduced voltage drop in the parasitic npn bipolar transistor, thus likewise diminishing the "latch-up" tendency.

Figure 2:
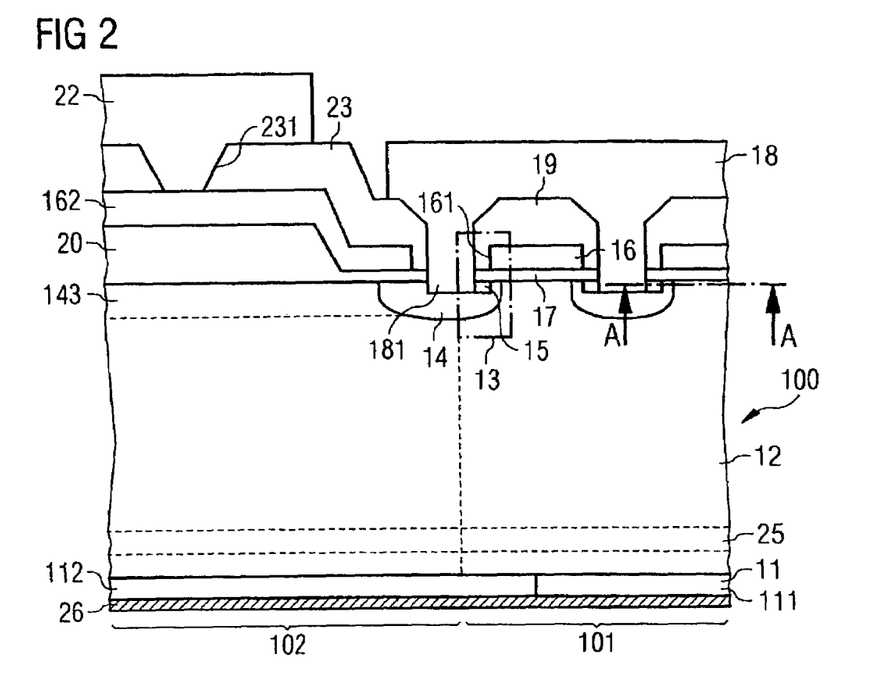
FIG. 2 shows part of a cross section through a power IGBT according to the invention which has a cell array section with a reduced cell density and an emitter zone with a reduced emitter efficiency in the region of this cell array section.
Figure 3:
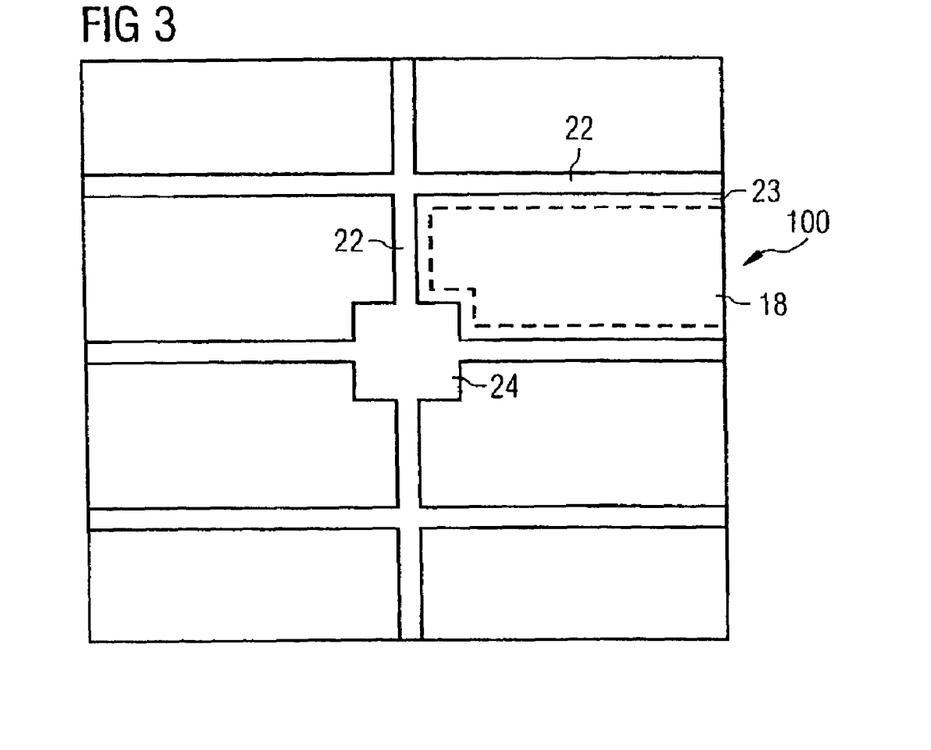
FIG. 3 shows a plan view of the power IGBT according to FIG. 2.
Figure 4:
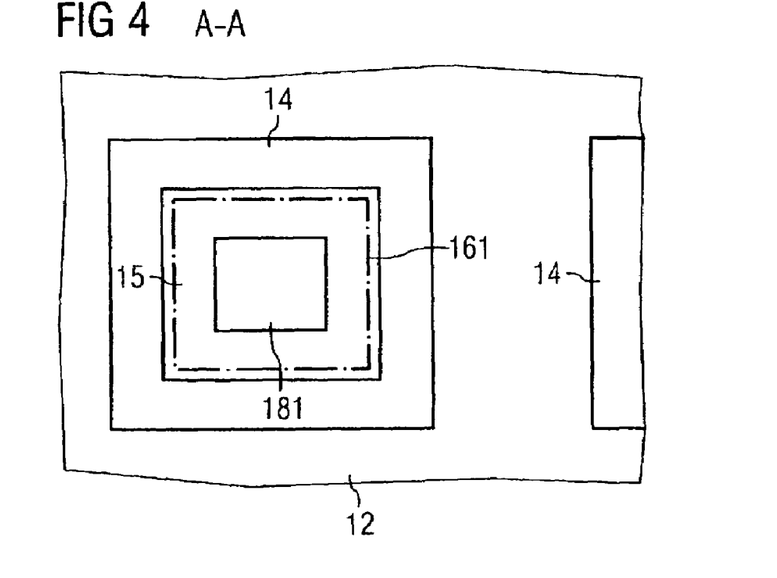
FIG. 4 shows a cross section through a transistor cell of the IGBT according to FIG. 2 in a sectional plane A-A illustrated in FIG. 2.

FIG. 2 illustrates part of a cross section through a first embodiment of a power IGBT according to the invention. FIG. 3 shows a plan view of the IGBT according to FIG. 2 on a reduced scale, and FIG. 4 shows a cross section in a sectional plane A-A illustrated in FIG. 2.

The IGBT illustrated in FIG. 2 is a vertical power IGBT and comprises a semiconductor body which has an emitter zone 11 of a first conduction type in the region of a first side, which is of the rear side in the example. This emitter zone 11 is adjoined, in the direction of a second side, which is the front side in the example, of the semiconductor body 100, by a drift zone 12 which is complementarily doped with respect to the emitter zone 11. A cell array having a plurality of identically constructed transistor cells 13 is arranged in the region of the front side, each of these transistor cells 13 having a source zone 15 of the second conduction type and a body zone 14 of the first conduction type which is arranged between the source zone 15 and the drift zone.

In the case of an IGBT, the emitter zone 11 and the body zone 14 are usually p-doped, while the drift zone 12 and the source zones 15 of the transistor cells 13 are usually n-doped. The source zones 15 and the body zones 14 of the individual transistor cells 13 are contact-connected by means of a terminal electrode 18, which is referred to as a source electrode below, and are short-circuited using this terminal electrode 18. Arranged adjacent to the body zones 14 of the individual transistor cells 13 is a gate electrode 16 which is dielectrically insulated with respect to the semiconductor body 100 by means of a gate insulation layer 17 and is used to control an inversion channel in the body zones 14 between the source zones 15 and the drift zone 12 in the transistor cells 13. The individual transistor cells 13 of the cell array have the drift zone 12 and the emitter zone 11 in common. The transistor cells are connected in parallel with one another by means of the common source electrode 18, the source electrode 18 being insulated with respect to the gate electrode 16 by means of a further insulation layer 19.

The transistor cells illustrated in the example according to FIG. 2 are so-called DMOS cells (DMOS=Double Diffused MOS). Referring to FIG. 4, the transistor cells are, for example, so-called "rectangular cells", that is to say cells whose body zone 14 is rectangular, in particular square. It goes without saying that it is also possible to implement the body zones 14 in a known manner using any other desired geometry, in particular in the form of a hexagon or strip.

The individual transistor cells 13 have a common gate electrode 16 which is in the form of a grid in plan view and has recesses 161 in the region of contact sections 181, which are used by the source electrode 18 to short-circuit the source and body zones 15, 14.

Referring to FIG. 3, a gate pad 24 which is used to apply a gate potential to the gate electrode (16 in FIG. 2) is arranged above the semiconductor body 100. Gate leads 22 run above the semiconductor body 100 starting from this gate pad 24. These leads 22 are in the form of fingers and are also referred to as gate fingers.

The left-hand part of FIG. 2 illustrates part of a cross section through one of these gate leads 22. The gate leads 22 are arranged above an insulation layer 23 having recesses 231 which are used by the gate leads 22 to contact-connect a section 162 of the gate electrode 16. This section 162 of the gate electrode which has been contact-connected is insulated with respect to the semiconductor body 100 by means of an insulation layer 20, this insulation layer 20 preferably being thicker than the gate insulation layer 17 in the region of the transistor cells.

There are no transistor cells under the gate leads 22 and, in particular, this region also does not contain any terminals to the source electrode 18 which would make it possible for holes to flow away from the drift zone 12 in the region under the gate leads 22 while switching off the component. In a corresponding manner, there are no transistor cells under the gate pad 24 either.

It is optionally possible to provide a semiconductor zone 143 in the region of the second cell array section 102 in the drift zone 12 under the top side facing the gate lead 22, said semiconductor zone being complementarily doped with respect to the drift zone 12 and preferably occupying the entire region in which there are no transistor cells. The doping concentration of this semiconductor zone 143 may correspond to the doping concentration of the body zones 14 of the transistor cells 13. In this case, this semiconductor zone 143 can be produced using the same method steps as are used to produce the body zones 14 of the transistor cells. However, it is also possible to carry out separate method steps in order to produce this semiconductor zone 143.

The semiconductor zone 143 which is complementarily doped with respect to the drift zone may—as is illustrated in FIG. 2—adjoin a body zone 14 of a transistor cell 13 and may be connected to the source electrode 18 by means of this body zone 14. In a manner which is not illustrated in any more detail, it is also possible to arrange this semiconductor zone 143 in a floating manner, that is to say not to connect this semiconductor zone 143 to the body zone of a transistor cell and thus not to connect this semiconductor zone to source potential.

In the example illustrated, the cell array of the IGBT has two cell array sections, a first cell array section 101 and a second cell array section 102. The cell densities, that is to say the number of transistor cells in relation to a prescribed area of the semiconductor body—which is greater than the area required for a transistor cell—are different for the two cell array sections. In the example, the cell density in the region of the second cell array section 102 is zero since there are no transistor cells here. The boundary between the first and second cell array sections 101, 102 is depicted in the form of a dashed line in the example. This boundary bounds the cell which is arranged at the edge of the first cell array section 101 in the direction of the second cell array section 102.

In the case of the component illustrated in FIG. 2, the invention provides for the emitter efficiency of the rear-side emitter 11 to be reduced, in comparison with other regions of the emitter 11, in the region of the second cell array section 102. One possible way of reducing the emitter efficiency is to locally reduce the emitter doping. In this case, the emitter 11 has a first emitter section 111 in the region of the first cell array section 101 and a second emitter section 112 in the region of the second cell array section 102. In this case, the effective doping of the emitter 11 with p-type dopant atoms is lower in the second emitter section 112 than in the first emitter section 111.

The lower doping of the second emitter section 112 can be achieved, for example, by implanting fewer dopant atoms into the second emitter section 112 than into the first emitter section 111 when producing the emitter zone 11 by means of ion implantation. A two-stage implantation method, for example, is carried out for this purpose. In this case, a masked implantation, which implants dopant atoms only into the first emitter section which is to be doped more highly, is carried out in a first step and dopant atoms are implanted over the entire area of the rear side of the semiconductor body 100 in a second step. A suitable dopant material for producing a p-doped emitter zone 11 is, for example, boron.

In addition, an emitter 11 having different effective doping concentrations can also be achieved by first of all producing a homogeneously doped emitter zone and then implanting non-doping particles in a masked manner into the region of this emitter zone 11 which forms the second emitter section 112. In this case, the non-doping particles give rise to crystal defects which reduce the effective p-type doping.

The reduction in the emitter efficiency of the emitter 11 in the second emitter section 112 in comparison with the first emitter section 111 results, when the IGBT is turned on, in there being fewer p-type charge carriers above the second emitter section 112 than above the first emitter section 111 in the drift zone 12. In comparison with a conventional power IGBT without a local reduction in the emitter efficiency, fewer p-type charge carriers need to be removed from the second cell array section 102, which does not have any terminals to the source electrode 18, in the case of the power IGBT according to the invention, thus reducing the hole current loading on transistor cells in the transition region between the first and second cell array regions 101, 102 and the hole current loading on the transistor cells which are arranged at the edge of the first cell array region 101 when switching off the component. This increases the "latch-up" strength of the transistor cells in the edge region of the first cell array section 101.

Figure 5:
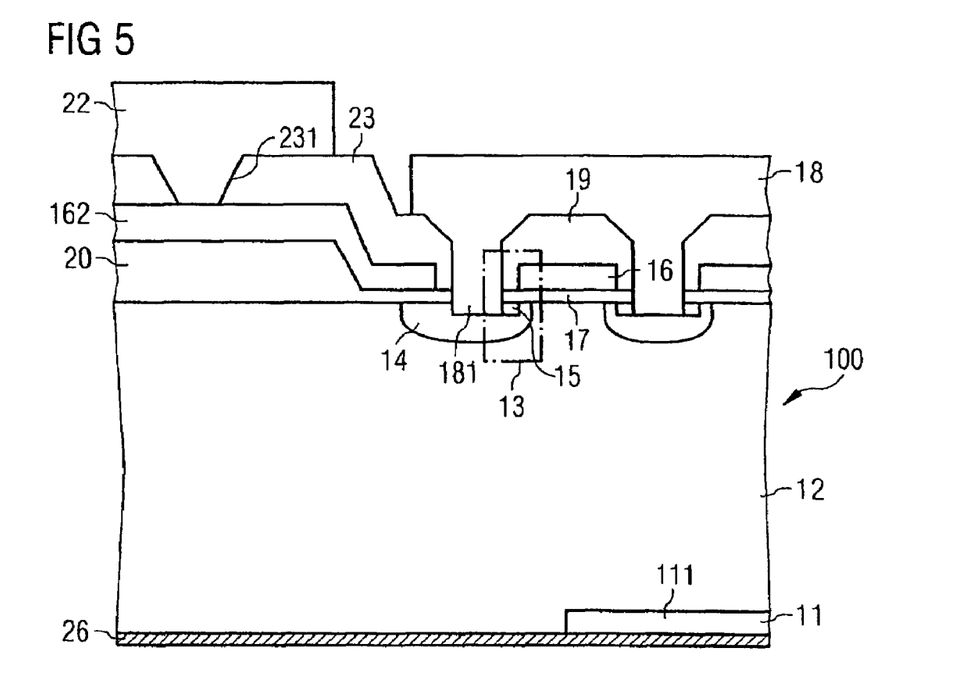
FIG. 5 shows a power IGBT according to the invention in which there is no emitter zone in the region of a cell array section with a reduced cell density.

Referring to FIG. 5, it is possible, in particular, to completely dispense with the presence of the emitter under the second cell array region 102. In this case, the drift zone 12 reaches to the rear side of the semiconductor body 100 and to a terminal electrode 26 which is applied to the rear side.

The second emitter section 112 with a reduced doping concentration preferably extends, in the lateral direction, in sections—preferably over a distance which is 0.1 to 2 diffusion lengths for free charge carriers in this region—to under the transistor cells of the first cell array region 101. This results, in a transition region between the first and second cell array regions and in the edge region of the first cell array region 101, in fewer p-type charge carriers, which have to flow away during the switching-off operation, being injected from the emitter 11 into the drift zone 12 when the component is turned on.

A field stop zone 25 which is of the same conduction type as the drift zone 12 but is doped more highly than the drift zone is optionally provided in the power IGBT. This field stop zone 25 is arranged between the emitter zone 11 and the body zones 14 but is preferably situated closer to the emitter zone 11 than to the body zones 14 and may, in particular, be directly adjacent to the emitter zone 11. This field stop zone 25 is illustrated using dashed lines in FIG. 2.

Figure 6:
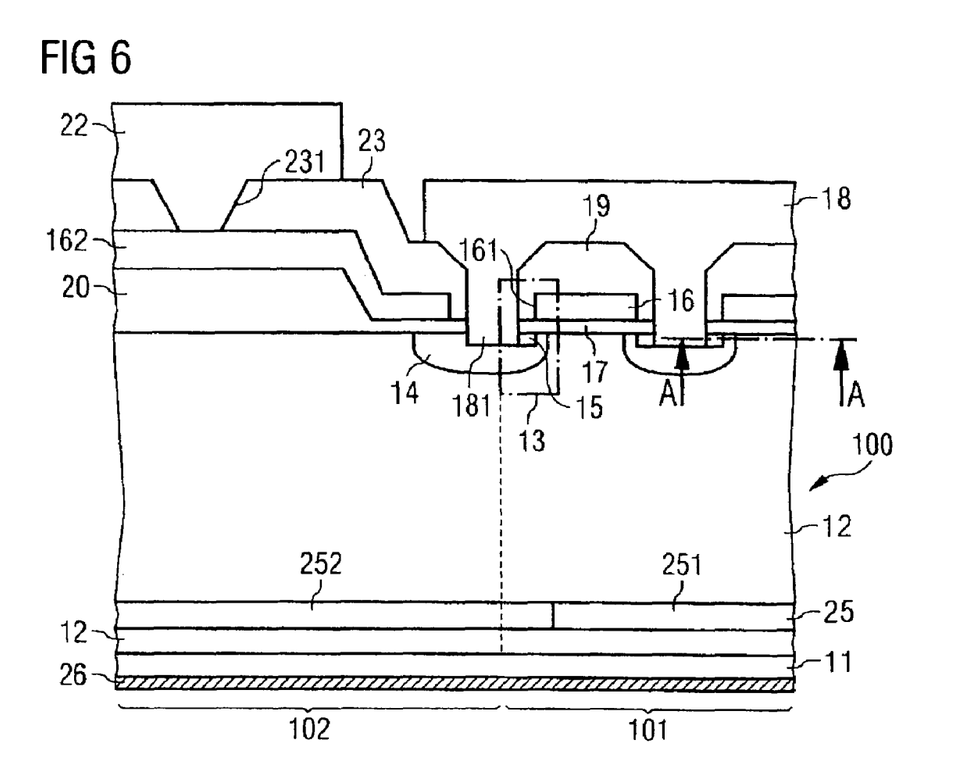
FIG. 6 shows a power IGBT according to the invention having a field stop zone which has a higher doping concentration in the region of a cell array section with a reduced cell density than in other regions.

As an alternative or in addition to reducing the emitter efficiency by locally reducing the doping of the emitter zone in the region of the second cell array section 102, it is possible, with reference to FIG. 6, to increase the "latch-up" strength of the component by locally increasing the doping concentration of the field stop zone 25 in the region of the second cell array section 102. This measure likewise reduces the emitter efficiency. In FIG. 6, the field stop zone 25 has two field stop zone sections 251, 252, a first field stop zone section 251 of which, which is arranged under the transistor cells of the first cell array section 101, is doped more lightly than a second field stop zone section 252 which is arranged in the region of the second cell array section 102. The second field stop zone section 252 which is more highly doped preferably reaches, in the lateral direction, to under the transistor cells of the first cell array section 101, that is to say under transistor cells which are arranged in the edge region of the first cell array section 101. The lateral extent of the more highly doped field stop zone into the first cell array section is preferably 0.1 to 2 diffusion lengths of the free charge carriers.

Locally increasing the doping concentration of the field stop zone 25 results, when the component is turned on, in fewer p-type charge carriers being injected into the drift zone 12 in the region of the second field stop zone section 252, with the result that fewer p-type charge carriers need to be removed from this region when the component is being switched off.

Figure 7:
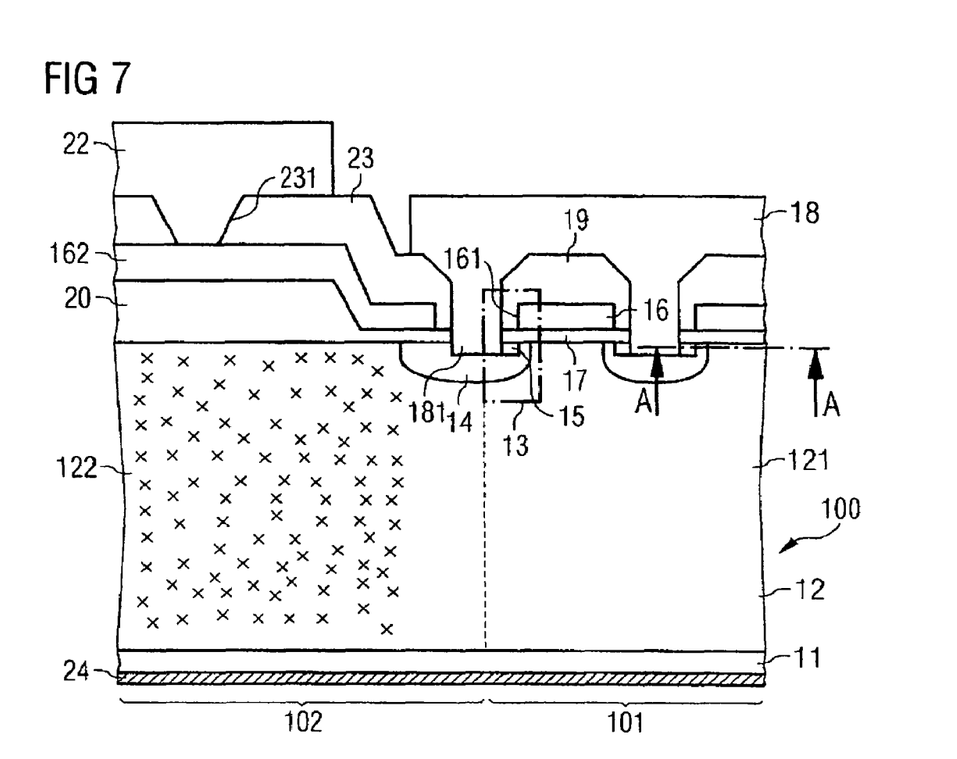
FIG. 7 shows a power IGBT according to the invention in which the charge carrier lifetime in a drift zone is reduced in the region of a cell array section with a lower cell density.

As an alternative or in addition to the measures explained above—locally reducing the emitter efficiency by locally reducing the emitter doping or by locally increasing the doping concentration of the field stop zone, it is possible, with reference to FIG. 7, to reduce the charge carrier lifetime for minority charge carriers, that is to say p-type charge carriers or holes in the present case, in the drift zone 12 in the region of the second cell array section 102. The component according to FIG. 7 has two drift zone sections, a first drift zone section 121 in the region of the first cell array section 101 and a second drift zone section 122 in the region of the second cell array section 102. In this case, the charge carrier lifetime for p-type charge carriers is shorter in the second drift zone section 122 than in the first drift zone section 121. In this case, the second drift zone section 122 preferably extends, in the lateral direction, to under the body zones 14 of those transistor cells which are arranged in the edge region of the first cell array section 101. The extent of this second drift zone section 122 into the first cell array section 101 is preferably 0.1 to 2 diffusion lengths of free charge carriers. The reduction in the charge carrier lifetime in the second drift zone section 122 results in fewer p-type charge carriers having to flow away from this section of the drift zone when the component is being switched off, thus reducing the hole current loading on the transistor cells in the edge region of the first cell array section 101 and thus increasing the "latch-up" strength of the transistor cells in comparison with a conventional component.

The charge carrier lifetime in the second drift zone section 122 can be reduced, for example, during a method for producing the power IGBT by means of masked irradiation of the semiconductor body with high-energy particles, for example electrons, protons or helium atoms. A metal mask can be used, for example, as a mask for such irradiation. These high-energy particles result in crystal defects in the region of the second drift zone section 122 and thus reduce the p-type charge carrier lifetime in this drift zone section 122.

The second drift zone section 122 in which the charge carrier lifetime has been reduced can be implemented, in particular, in such a manner that the extent to which the charge carrier lifetime is reduced varies in the vertical direction. Such a vertical variation in the charge carrier lifetime can be achieved, in particular, by irradiating the front side or rear side of the semiconductor body 100 with protons or helium atoms. Such "heavy" particles generate inhomogeneous crystal defect distribution in the semiconductor body, the maximum being in the direction of the irradiation side. The second drift zone section 122 is advantageously produced in such a manner that the greatest reduction in the charge carrier lifetime is present in a region adjacent to the emitter zone 11—that is to say where the holes are injected into the drift zone—or in a region under the gate lead or in the vicinity of the body zones 14 of the transistor cells 13.

Figure 8:
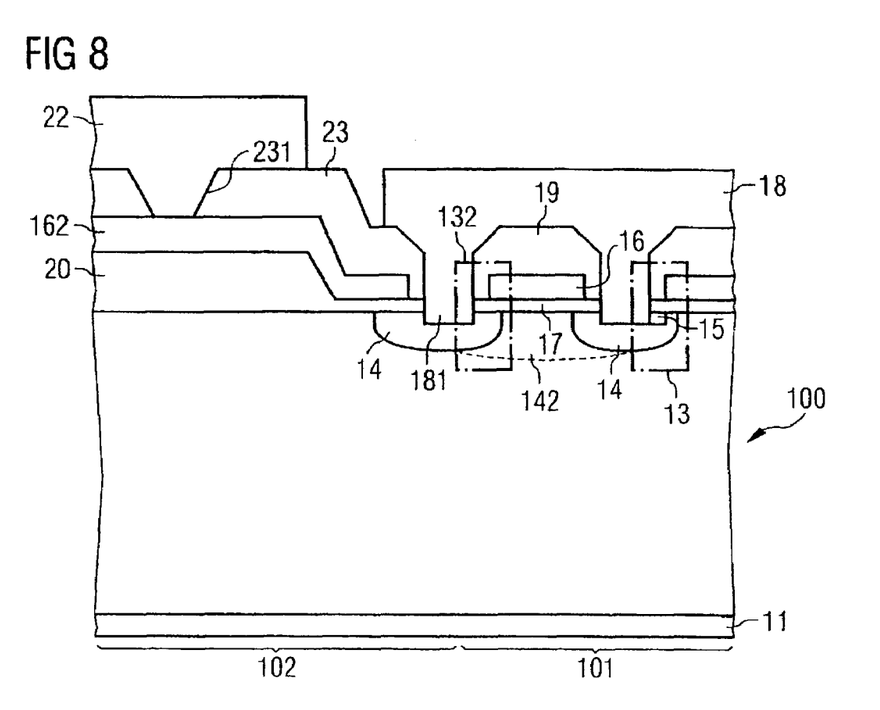
FIG. 8 shows a power IGBT according to the invention in which a short circuit area between a terminal electrode and a body zone is increased in a transition region between a first cell array section and a second cell array section having different cell densities.

As an alternative or in addition to the measures explained above for increasing the "latch-up" strength, it is possible, with reference to FIG. 8, to increase the contact area, in the edge region of the first cell array section 101, between the body zones of the transistor cells in this edge region and the source electrode 18 in comparison with other transistor cells of the first cell array section 101. This increase in the contact area can be achieved, for example, by providing modified cells 132 in the edge region of the first cell array section 101, said cells not having a source zone, with the result that the electrode sections 181 contact-connect only the body zone 14 in these cells. As illustrated using dashed lines in FIG. 8, it is also possible to produce a p-doped semiconductor zone 142 in the edge region of the first cell array section 101, the lateral dimensions of said semiconductor zone being greater than the lateral dimensions of the body zones of the transistor cells in order to contact-connect this p-doped semiconductor zone 142 at a plurality of points or over the entire area using the terminal electrode 18.

Figure 9:
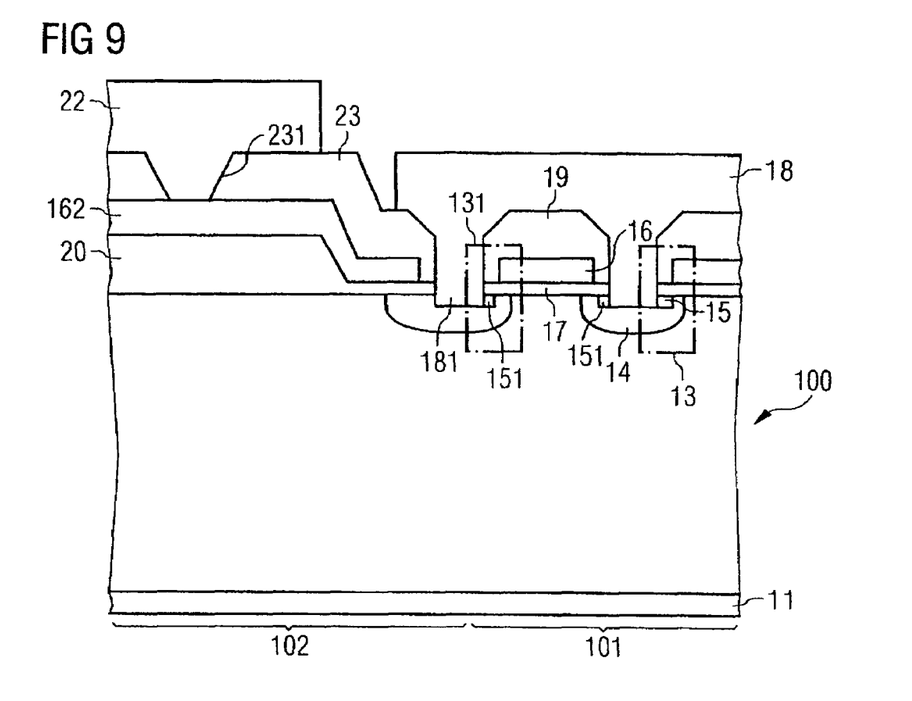
FIG. 9 shows a power IGBT according to the invention which has transistor cells in a transition region between a first cell array section and a second cell array section, the source zones of said transistor cells having smaller dimensions in the direction of the flow of holes.

Another measure for increasing the "latch-up" strength, which can be provided as an alternative or in addition to the measures of FIGS. 2 to 7, involves, with reference to FIG. 9, providing modified transistor cells 131 in the edge region of the first cell array section 101, the source zones 151 of said transistor cells having smaller dimensions than other transistor cells 13 of the first cell array section 101 in the lateral direction of the semiconductor body 100. In these modified transistor cells 131, a given hole current results in a smaller voltage drop under the modified source zone 151 in comparison with a voltage drop which would be caused by such a hole current under a "standard" source zone 15, that is to say a source zone 15 having dimensions which have not been reduced. This results in an increase in the "latch-up" strength of these transistor cells in the edge region of the first cell array section 101.

Figure 10:
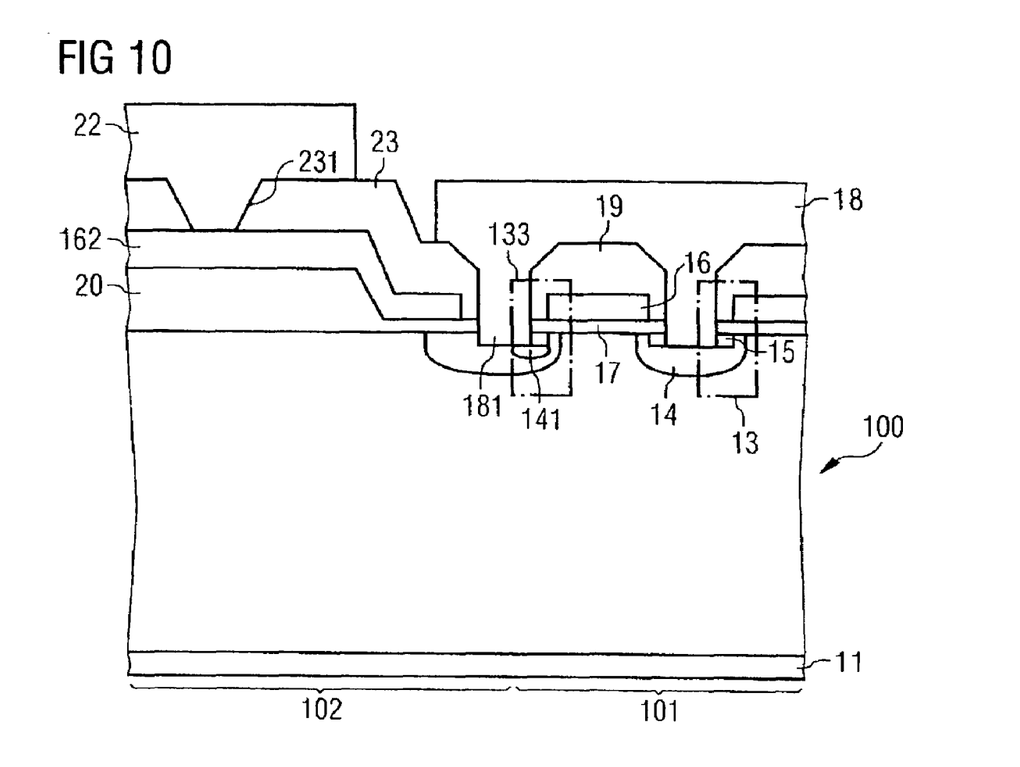
FIG. 10 shows a power IGBT according to the invention which has at least one transistor cell having a locally increased doping concentration of the body zone in the transition region between two cell array sections with different cell densities.

Another measure for reducing the voltage drop under the source zone 15 of transistor cells in the edge region of the first cell array section 101 involves, with reference to FIG. 10, doping at least sections of the body zone 14 more highly in transistor cells of the edge region under the source zones 15. Such a more highly doped section is denoted using the reference symbol 141 in FIG. 10. With a given hole current, this locally increased doping of the body zone 14 results in a smaller voltage being dropped under the source zone 15 of such a modified transistor cell 131 than under the source zone of a "standard" transistor cell without such a locally increased doping concentration of the body zone 14.

In summary, it shall once again be pointed out that the measures which were explained with reference to FIGS. 2 to 7 and are intended to increase the "latch-up" strength, namely locally reducing the emitter efficiency by means of locally reduced emitter doping, locally increasing the doping concentration of the field stop zone or locally reducing the charge carrier life-time in the drift zone, can each be carried out as an alternative to one another or else together. In addition or as an alternative to these measures, transistor cells in the edge region of the first cell array region 101 can be modified in accordance with the explanations relating to FIGS. 8 to 10 in order to likewise increase the "latch-up" strength of the power IGBT.

The measures according to the invention for increasing the "latch-up" strength of a power IGBT were explained above with reference to a power IGBT which has a cell array having planar transistor cells or DMOS cells. It goes without saying that these measures, namely reducing the emitter efficiency by means of a locally reduced doping of the emitter zone or by means of a locally increased doping of a field stop zone or a local reduction in the charge carrier lifetime in the drift zone, can also be applied to a power IGBT which has a cell array having trench cells.

Figure 11:
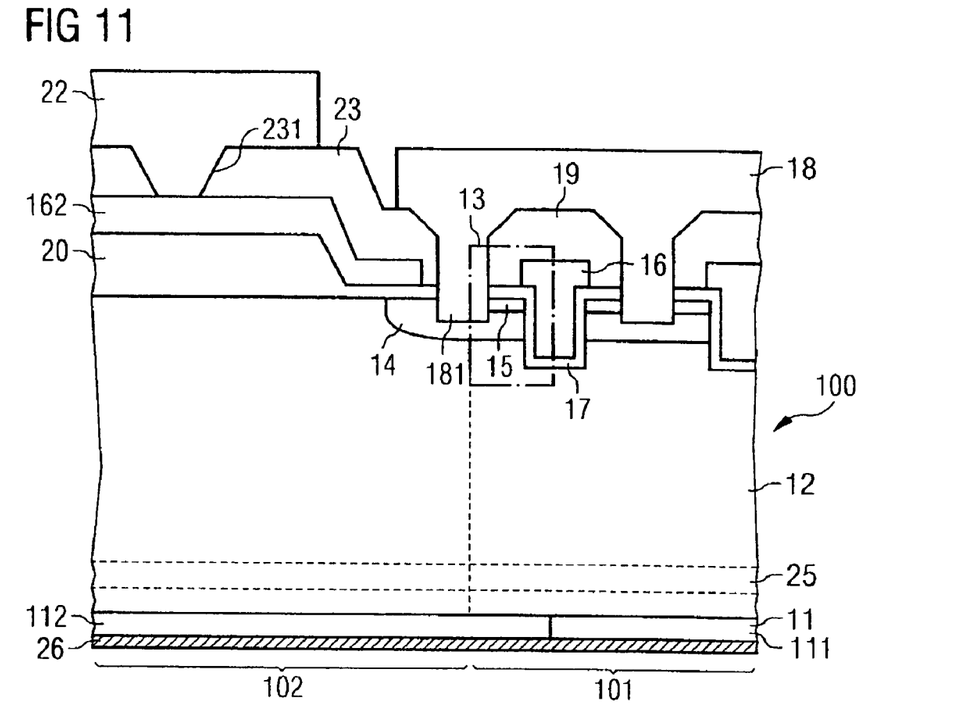
FIG. 11 shows a power IGBT according to the invention in the form of a trench IGBT.

FIG. 11 shows such a power IGBT having trench cells. This IGBT differs from the IGBT having planar cells explained above by virtue of the fact that the gate electrodes 16 of the individual transistor cells 13 are arranged, at least in sections, in trenches which extend, in the vertical direction, into the semiconductor body 100. In this case, the gate electrodes 16 are likewise insulated with respect to semiconductor zones of the semiconductor body 100 by means of a gate insulation layer 17 and extend, in the vertical direction, through the body zones 14 into the drift zone 12. In this case, the individual transistor cells may have a common body zone, in particular. Channel zones in which conductive channels are formed in the body zones 14 when a drive potential is applied to the gate electrodes 16 run in the vertical direction in this component.

The "latch-up" problem (explained at the outset) in the transition region between a first cell array section 101 with a first cell density and a second cell array section with a lower second cell density exists in the same manner in a power IGBT having trench cells. In order to avoid or reduce this problem, provision is made, in the component according to FIG. 11, for the emitter efficiency of the emitter zone 11 to be reduced in the region of the second cell array section 102. For this purpose, the doping of the emitter 11 in the second emitter section 112 is reduced in comparison with a doping of the emitter in the first emitter section in the example. As an alternative or in addition to reducing the emitter efficiency by locally reducing the emitter doping, the emitter efficiency can be reduced, in the manner explained, by providing a field stop zone which has a locally increased doping in the region of the second cell array section.

As an alternative or in addition to reducing the emitter efficiency, the other measures which were explained above with reference to FIGS. 7 to 10 and are intended to reduce or avoid the latch-up problem can also be taken in the case of a power IGBT having trench cells. These measures include locally reducing the charge carrier lifetime in the drift zone, a locally increased doping of the body zones 14 adjacent to the source zone 15 in those cells which are arranged at the edge of the first cell array section 101, reducing the dimensions of the source zones 15 in those cells which are arranged at the edge of the first cell array section 101 or increasing the short-circuit area between the source electrode 18 and the body zone 14 at the edge of the first cell array section 101.

LIST OF REFERENCE SYMBOLS

11 Emitter zone
12 Drift zone
13 Transistor cell
14 Body zone
15 Source zone
16 Gate electrode
17 Gate insulation layer
18 Terminal electrode, source electrode
19, 20 Insulation layer
22 Gate lead
23 Insulation layer
24 Gate pad
25 Field stop zone
100 Semiconductor body
111, 112 Emitter sections
121, 122 Drift zone sections
131-133 Modified transistor cells
141-143 Semiconductor zone of the first conduction type
151 Source zone
161 Recess of the gate electrode
162 Section of the gate electrode
181 Contact section of the terminal electrode
231 Recess
251, 252 Field stop zone sections

What is claimed is:

1. A power IGBT comprising:
   a semiconductor body having an emitter zone of a first conduction type and a drift zone of a second conduction type proximate to the emitter zone,
   a cell array having a number of transistor cells which each have a source zone, a body zone disposed between the source zone and the drift zone, the body zone and source zone short-circuited, and a gate electrode configured to be insulated with respect to the source zone and the body zone,
   the cell array having a first cell array section with a first cell density and a second cell array section with a second cell density that is lower than the first cell density, wherein the emitter zone has a lower emitter efficiency in a region corresponding to the second cell array section than in a region corresponding to the first cell array section.

2. The power IGBT as claimed in claim 1, wherein:
   the emitter zone has a first emitter section in the region corresponding to the first cell array section and a second emitter section in the region corresponding to the second cell array section; and
   an effective doping concentration of dopant atoms of the first conduction type of the second emitter section is lower than an effective doping concentration of the first emitter section.

3. The power IGBT as claimed in claim 2, wherein the lower effective doping concentration in the second emitter section is formed through the use of crystal defects in the second emitter section.

4. The power IGBT as claimed in claim 1, wherein the region of the emitter zone with the lower emitter efficiency extends partially into an area corresponding to the first cell array section.

5. The power IGBT as claimed in claim 4, wherein dimensions by which the region with the lower emitter efficiency extends into the area corresponding to the first cell array section are between 0.1 to 2 diffusion lengths of free charge carriers.

6. The power IGBT as claimed in claim 1, wherein a field stop zone of the second conduction type is arranged in the drift zone between the body zones of the cell array and the emitter zone, said field stop zone being doped more highly than the drift zone.

7. The power IGBT as claimed in claim 1, wherein the second cell array section includes no transistor cells.

8. The power IGBT as claimed in claim 7, further comprising a semiconductor zone in the second cell array section spaced apart from the emitter zone and complementarily doped with respect to the drift zone.

9. The power IGBT as claimed in claim 8, wherein the complementarily doped semiconductor zone is arranged in a floating manner.

10. The power IGBT as claimed in claim 8, wherein the complementarily doped semiconductor zone is connected to the body zone.

* * * * *